United States Patent [19]

Erhart et al.

[11] Patent Number: 5,051,999
[45] Date of Patent: Sep. 24, 1991

[54] PROGRAMMABLE ERROR CORRECTING APPARATUS WITHIN A PAGING RECEIVER

[75] Inventors: Richard A. Erhart, Boynton Beach; Joan S. DeLuca, Boca Raton; Kevin T. McLaughlin, Lake Worth, all of Fla.

[73] Assignee: Motorola, Inc., Schaumburg, Ill.

[21] Appl. No.: 322,437

[22] Filed: Mar. 13, 1989

[51] Int. Cl.⁵ ............................................. G06F 11/10
[52] U.S. Cl. ..................................... 371/41; 371/37.1
[58] Field of Search ...................... 371/41, 37.2, 38.1, 371/39.1, 37.1, 2.1; 340/825.44, 825.48; 455/38, 33

[56] References Cited

U.S. PATENT DOCUMENTS

| | | | |
|---|---|---|---|
| 3,078,443 | 2/1963 | Rose | 371/41 |
| 3,372,376 | 3/1968 | Helm | 371/41 |
| 3,656,107 | 4/1972 | Hsiao | 371/37.2 |
| 4,194,153 | 3/1980 | Masaki et al. | 455/31 |
| 4,618,955 | 10/1986 | Sharpe | 371/38.1 |
| 4,649,543 | 3/1987 | Levine | 371/41 |
| 4,654,853 | 3/1987 | Moriyama | 371/41 |
| 4,701,923 | 10/1987 | Fukasawa | 371/41 |
| 4,755,816 | 7/1988 | DeLuca | 340/636 X |
| 4,843,607 | 6/1989 | Tong | 371/38.1 X |
| 4,910,511 | 3/1990 | Nagata | 340/825.44 |

OTHER PUBLICATIONS

A Standard Code for Radiopaging (POCSAG), 7/1979, pp. 4–40.
A Decoding Procedure for Multiple-Error-Correcting Cyclic Codes, Tadao Kasami, Student Member, IEEE Information Theory, 1964, pp. 134–138.

Primary Examiner—Clark A. Jablon
Assistant Examiner—Robert W. Beausoleil
Attorney, Agent, or Firm—Gregg E. Rasor; Vincent B. Ingrassia

[57] ABSTRACT

A paging receiver receiving message information having one of a plurality of (BCH) code word structures has a programmable error correcting apparatus for correcting bit errors within the message information. The programmable error correcting apparatus may be configured in response to identifying a signalling system and the code word structure corresponding to ther signalling system, or in response to changes in the code word structure within the message. A simplified error correcting apparatus may correct a single bit error within a code word structure. The programamble error correcting apparatus is capable of correcting any two bit error combination within the code word structure and contains sequential and combinational logic circuits. The programmable error correcting apparatus is integrated together with a microprocessor on a monolithic integrated circuit.

16 Claims, 10 Drawing Sheets

PROGRAMMABLE ERROR CORRECTING APPARATUS WITHIN A PAGING RECEIVER

DESCRIPTION OF THE PRIOR ART

I. Field of the Invention

This invention relates generally to the area of correcting errors in data signal having parity which provides for error correction. More specifically, this invention relates to the area of a paging receiver which receives an error correcting signal and operates a programmable error correcting apparatus therein.

II. Background of the Invention

Error correcting codes typically consist of code words having a predetermined number, "n", of binary bits. Of the "n" bits, a second predetermined number. "k" are information bits. The remaining bits "n-k" are parity bits. Of the correctable bits in the code word, "e" bits may be chosen to be corrected. A convention for identifying code words is "(n,k,e)". Such words include (15,7,2), (23,12,1), (31,16,2), (31,21,1), and (31,21,2). For example (31,21,2) represents a code word having 31 bits, 21 of which are information bits, and up to 2 of the 31 bits will be corrected if they are in error. Note that the use of the "e" value is optional in the convention.

The use of error correcting codes has been shown in several paging protocols. The Golay Sequential Code (GSC) shows the use of (23,12,2) and (15,7,2) code words. The GSC paging protocol and operation of a pager therein, is shown in allowed U.S. Pat. No. 4,860,003 to DeLuca et al. The (31,16,2) code word may be used in a paging protocol shown in the New Radio Paging System (NRPS) by U.S. Pat. No. 4,194,153 to Masaki et al., Mar. 18, 1980. A digital signaling protocol proposed by British Telecom in England which is commonly termed POCSAG (Post Office Code Standardization Advisory Group) and shows use of the (31,21,1) and the (31,21,2) code words. The operation of POCSAG is shown in a report "A Standard Code for Radio paging," published by the British Post Office, July 1979.

A message received by a paging receiver includes an address portion and a data portion. Both address and data portions include at least one code word. An address code word may be identical to or different from the data code word. In GSC, the address is a (23,12,2) code word while the data is a (15,7,2) code word. In POCSAG the address is a (31,21,2) code word while the data is treated as a (31,21,1) code word. While in NRPS, both the address and data may be (31,16,2) code words.

In prior art paging receivers operating on a system having two different code word structures, such as GSC, POCSAG and NRPS, a common means is not used to decode both structures. For example prior art paging receivers having a microcomputer would have one subroutine for operating on the address code word and a separate subroutine for operating on the data code word.

Prior art paging receivers emulate 2 bit error correction on address code words with a relatively simple task of correlating the received code word with a predetermined address code word assigned to the paging receiver. Correlating involves comparing the two code words and counting the number of differences, if the number of differences are less than or equal to the number of allowable bit errors, the address is considered decoded. The correlation process is not a true error correction process. The true error correction process involves identifying the location of errors in any received code word and correcting the errors.

The correlating process allows prior art pagers to effectively perform 2 bit error correction on address code words. Because of the complexity involved with the error correction process, prior art paging receivers have been limited to single bit error correction on data code words with more than 15 bits. Because of the small size of the 15 bit code word, two bit error correction is performed in prior art paging receivers. However, multiple bit error correction on longer 23 and 31 bit words requires substantially more processing. The additional processing effectively exceeds the processing power available to prior art paging receivers. Methods for correcting multiple bit errors using an error correcting code has been shown in "A Decoding Procedure for Multiple-Error-Correcting Cyclic Codes", Tadao Kasami, IEEE Transactions, April 1964, pages 134–138.

It is desirable to perform 2 bit error correction on received data in order to improve the sensitivity of the paging receiver. It is desirable to do this without adding substantially more processing power to a paging receiver.

In the prior art, single error correction of data code words is being performed in software algorithms. These algorithms consume code space and CPU cycles. This translates to larger memory required (larger silicon area) and increased power consumption for a pager. Thus it is desirable to provide a hardware error correcting apparatus which will remove the burden of this task from the microprocessor decoder. It is also desirable for the hardware error correcting apparatus to be programmable, allowing it to handle a variety of code words with reduced power consumption and silicon area. It is further desirable to increase the correction capacity of code words to two bits.

SUMMARY OF THE INVENTION

It is therefore an object of the present invention to provide a means for resolving the aforementioned issues.

It is an object of the invention to provide a programmable error correcting means for correcting a single bit error in a plurality of code word structures.

It is another object of the invention to provide a simplified means for correcting two bit errors in a code word structure having more information bits than parity bits.

It is yet another object of the invention to provide a programmable error correcting means capable of being programmed to vary the total number of bits in a code word on which error correction is being performed.

It is yet another object of the invention to provide a programmable error correcting means capable of being programmed to vary the number of information bits in a code word on which error correction is being performed.

It is yet another object of the present invention to provide a circuitry which provides for programmable error correction and incorporate that circuitry onto an integrated circuit which includes a microcomputer capable of programming the programmable error correcting means.

It is yet another object of the present invention to determine the protocol received by the paging receiver and program the error correcting means in response thereof.

In accordance with the present invention, a method of correcting errors within message information received by a paging receiver is provided. The paging receiver is capable of receiving message information transmitted on at least one of a plurality of signalling systems. Each signalling system has code words within which the message information is included. Each code word has a structure, the code word structure having one of a plurality of information and parity combinations providing for error correction, wherein each signalling system has a corresponding code word structure. The paging receiver includes a programmable error correcting means capable of being programmed to correct errors in each of the plurality code word structures. The method comprising the steps of determining the signaling system on which the message is received, and programming said programmable error correcting means in response to the determination thereof.

In accordance with the present invention, a programmable error correcting means for correcting bit errors in data within one of a plurality of code word structures is provided. Each code word structure has n total bits, k information bits and n-k parity bits, the parity bits being generated by multiplying the k information bits by a generator polynomial $g(x)$. The combination of n, k and $g(x)$ are unique to each code word structure. The error correcting means comprises a selecting means for determining the code word structure of the data. The error correcting means further comprises a memory means for storing the data, said memory means capable of shifting the data, said memory means having a first correcting means for complementing locations within said memory means. The error correcting means further comprises a programmable linear feedback shift register means programmed with a feedback value corresponding to $g(x)$, and said programmable linear feedback shift register further programmed to receive the n bits of data and calculate a first syndrome in response to the reception thereof, wherein each shift of the linear feedback register calculates a subsequent syndrome, and further wherein the first and subsequent syndromes have n−k bits, and further wherein the values of n, k, and the feedback value corresponding to $g(x)$ are programmed in response to the code word structure determined by said selecting means. The error correcting means further comprises a weight check means for generating a first correct signal in response to the first or subsequent syndromes having a weight less than or equal to a first predetermined value, thereby having a number of logical ones less than or equal to the first predetermined value. And the error correcting means further comprises a control means responsive to said weight check means for causing shifting of said memory means and said linear feedback shift register means and for causing said first correcting means to complement the bits corresponding to the locations of the logical ones within the first or subsequent syndromes in response to the first correct signal.

BRIEF DESCRIPTION OF THE DRAWINGS

Identical numerals between the figures signify corresponding signals of functions between the figures.

DESCRIPTION OF A PREFERRED EMBODIMENT

Figure 1:
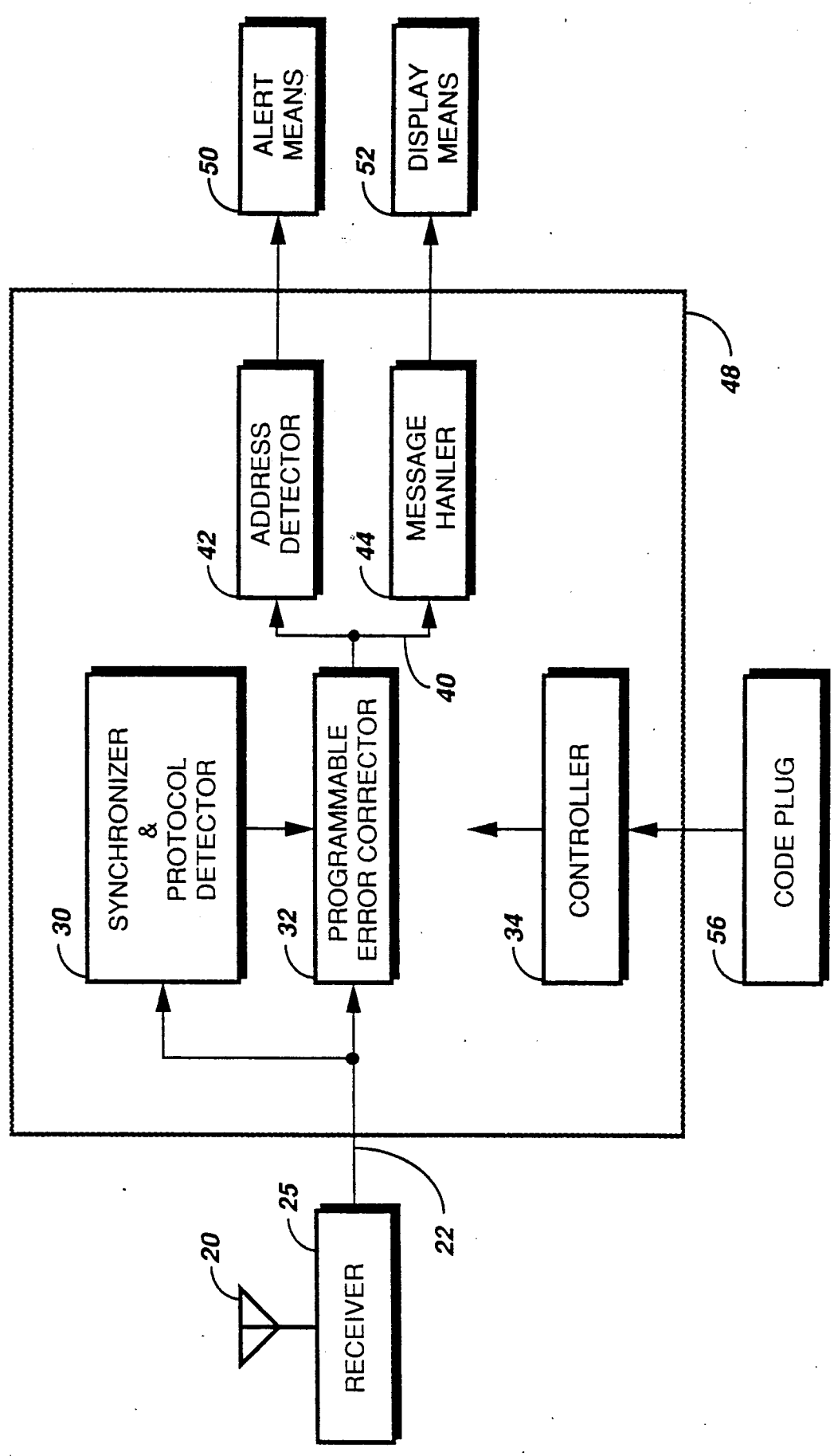
FIG. 1 shows a paging receiver including the present invention.

FIG. 1 shows a paging receiver including the present invention. Frequency modulated signals including at least one paging protocol are received by antenna 20 and processed into binary signals 22, by receiver 25. When a protocol is present, the binary signals include data bits which are synchronized to by synchronizer 30. Synchronizer 30 may be capable of identifying and synchronizing to one of a plurality of protocols, and producing a signal indicative of the protocol. Such a synchronizer and protocol identifier is described in U.S. Pat. No. 4,518,961, May 21, 1985, to Davis et al, which is hereby incorporated by reference. Alternately, a synchronizer which synchronizes onto a single protocol may be used. In either case, synchronizer 30 supplies bit and frame synchronization timing signals to error correcting means 32.

The error correcting means 32, is programmed to receive and error correct a code word using an expected code word structure. The error correcting means is programmed by controller 34 which programs the code word structure in response to either the protocol detected by synchronizer 30 in a first alternative, the protocol indicated by code plug 56 in a second alternative, or a single predetermined protocol in a third alternative. Code plug 56 is a PROM which includes address information unique to the paging receiver. Code plug 56 may also include information indicative of the signalling protocol and the structure of the code words to be received by the paging receiver. Controller 34 also programs the error correcting means 32 in response to the status of the signal being received, for example a (32,21,2) structure is used while receiving a POCSAG address code words, and a (32,21,I) structure is used while receiving POCSAG data code words.

Upon receiving and correcting a code word, the error correcting means 32 produces a signal 40 indicating that the code word was successfully corrected and including the corrected code word, or that the code word had too many errors for the programmed structure and was thus uncorrectable.

The signal 40 is used by address detector 42 while searching for the address portion of a message. If the information in the corrected code word matches the address stored in the code plug 56, the beginning of the message is found and alert means 50 is activated indicating the reception of a message. If the message has information associated with it, the signal 40 is received by data handler 46. The data portion is then displayed on display means 52 in a manner well known in the art.

It can be appreciated that functions 30-46 may be implemented by software operating within a host microcomputer, as shown enclosed by dashed box 48. A microcomputer such as the Motorola MC6805HC4 which is the preferred host microcomputer of the invention may be used. Furthermore, in the preferred embodiment, programmable error correcting means 32 is incorporated within additional circuitry added to the microcomputer, thus reducing the amount of processing required by the microcomputer in order to perform the task of receiving a message.

Figure 2:
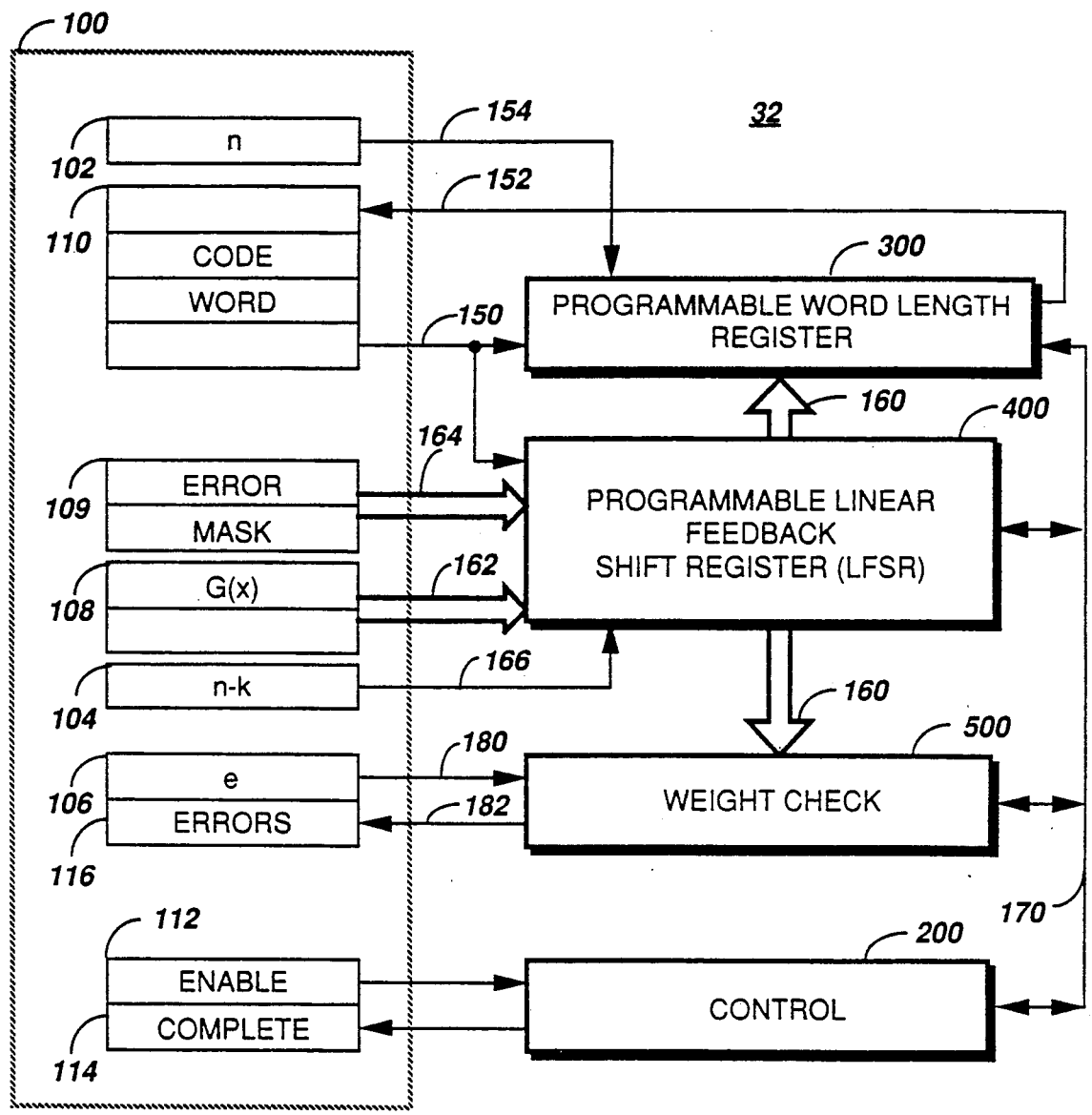
FIG. 2 shows a block diagram of a programmable error correcting means, in accordance with the present invention.

FIG. 2 shows a block diagram of programmable error correcting means 32. Shown inside of area 100 enclosed by a broken line are the registers used to program the programmable error correcting means. The registers are 8 bits long and accessed in a manner familiar to those skilled in microcomputer programming. Register 102 programs the value "n" which is equivalent to the number of bits in the code word. Register 104 programs the value "n−k" which is equivalent to the number of parity bits in the code word. Register 106 programs the value "e" which is the maximum number of bits to be corrected by the error correcting means. Register set 108 programs the generator polynomial G(x) which is used in the error correction process. Register set 109 programs the error mask which is used in the error correction process on code words requiring 2 bits of correction and having a ratio of n/k<0.5.

A code word recovered using bit and frame synchronization signals is written into code word register set 110. Setting the enable register 112 starts the error correction process. When the process is complete, the complete register 114 is set by control means 200, and the result of the correction process is written into errors register 116. If less than or equal to "e" errors are corrected, the number of errors corrected will be written into errors register 116. If more than "e" errors are detected, the errors register will indicate that the word is uncorrectable. If the word is uncorrectable, the original code word will remain in code word register set 110. Likewise, if no errors were detected in the code word, the original code word will remain in code word register set 110. If a correction was performed, the corrected code word will be loaded into code word register 110.

The circuitry which operates on the information included within the registers 100 includes a control means 200 a programmable word length register 300, a programmable Linear Feedback Shift Register (LFSR) 400, and a weight check function 500. The operation of these will be detailed in the following figures.

Figure 3:
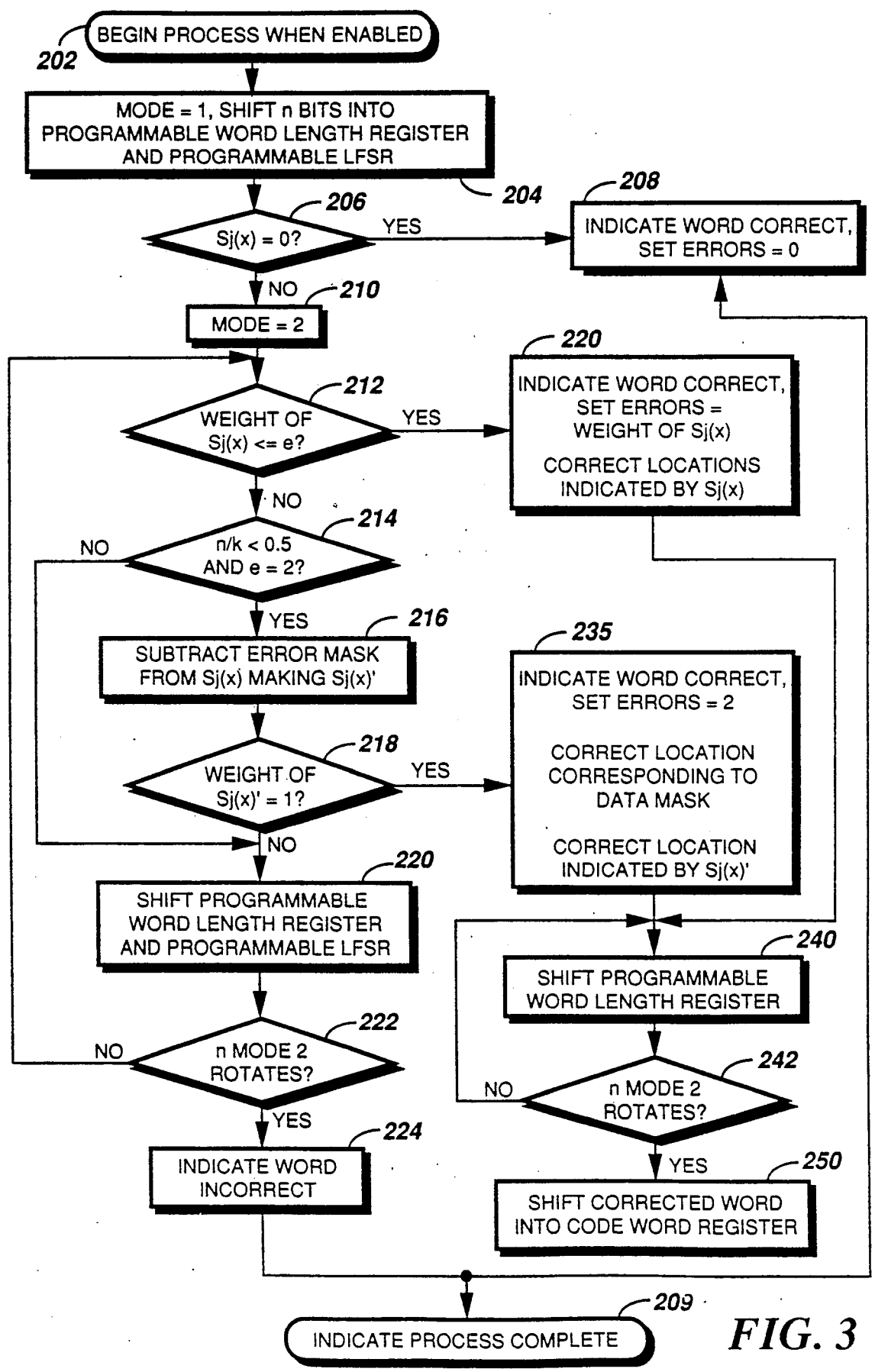
FIG. 3 shows a flow chart detailing the operation of the control means.

FIG. 3 shows a flow chart detailing the operation of the control means 200. In the preferred embodiment, the control means is implemented using CMOS combinational logic. The information provided herein is sufficient to enable one skilled in the art to construct the control means from sequential and combinational logic circuits.

Prior to execution of the flow chart of FIG. 3, "n" register 102, code word register set 110, error mask register set 109, G(x) register set 108, "n−k" register 104 and the "e" register 106 are programmed using software executed within the microcomputer. Step 202 is entered when enable register 112 is enabled. In step 204, the control means causes registers 300 and 400 to operate in mode 1 while n bits are shifted into each register. Then in step 206, the syndrome Sj(x) is calculated by LFSR register 400 and the weight is checked by weight check means 500 to be equal to zero. If zero, step 208 is executed where the code word is indicated correct and zero errors is loaded into errors register 116. Finally, in step 209, the error correction process is complete, and such an indication is made in complete register 114. This path is equivalent to the code word being received with no errors.

If Sj(x) is not zero in step 206, registers 300 and 400 are placed in mode 2, step 210, no new data is entered and the contents of the registers are shifted. As will be detailed later, while in mode 2, a shift of the programmable LFSR results in a new value for Sj(x). Next in step 212 the weight of the syndrome Sj(x) is checked to be less than or equal to "e". The weight is determined by weight check means 500, the weight is equivalent to the number of binary "1"s in Sj(x)

If the weight is not less than or equal to "e", step 214 checks if the covering polynomial should be used. The conditions for use are if the ratio of n/k is less than 0.5 and e=2. This corresponds to a code word structure having more information bits than parity bits and 2 bit error correction being desired. If true, in step 216, the error mask is subtracted, using modulo 2 arithmetic, from the syndrome to form a new syndrome Sj(x)'. Then in step 218, the weight of Sj(x)' is checked to be equal to 1. If the answer is false, step 220 is executed. Also, if the answer is false in step 214, step 220 is executed.

In step 220, the programmable word length register 300, and the programmable LFSR 400, are shifted. Shifting of the programmable word length register results in a one bit circular shift of the code word within the register. Shifting of the programmable LFSR while in mode 2, where the input data is forced to zero, results in the calculation of a new syndrome Sj(x).

In step 222, the number of rotations is checked to be equal to "n". If equal, an number of syndromes Sj(x) have been checked without finding a syndrome which provides for error correction. In this case, the code word is not correctable and step 224 loads the indication into errors register 116. Finally, in step 209, the error correction process is complete, and such an indication is made in complete register 114.

Referring back to step 212, if the weight of Sj(x) is less than or equal to "e", the code word is correctable, and the number of bit errors is equal to the weight of Sj(x). In step 230, the indication that the code word is correct and the number of bit errors is made in errors register 116. The correction process is then enabled. The locations of the "1"s in Sj(x) corresponds to the location of the bit error(s) in the rotated code word in the programmable word length register. The correction process involves using Sj(x) to selectively complement bit(s) in error during a rotation of the programmable word length register. After the correction is made step 240 is executed.

Referring back to step 218, if the weight of Sj(x)'=1, step 235 is executed. This condition means that the word is also correctable and has 2 bit errors. This indication is made in errors register 116. The error mask has a correspondence to a covering polynomial indicating a predetermined bit location being in error beyond the correction range of Sj(x). This bit location cannot be corrected using Sj(x) because the number of bits between the bit error in the predetermined location and the bit error indicated by Sj(x) is greater than the number of parity bits in the code word structure. Consequently there is one bit error in a predetermined location and one bit error in a location indicated by Sj(x)'. The correction process involves complementing these two locations on a shift of the programmable word length register. After the correction is made step 240 is executed.

Step 240 and 242 work to ensure that n rotates of the programmable word length register have been made, thus restoring the corrected code word to its original orientation. In step 250, the corrected code word is rotated back into the code word register set 110. Finally, in step 209, the error correction process is complete, and such an indication is made in complete register 114.

Figure 4:
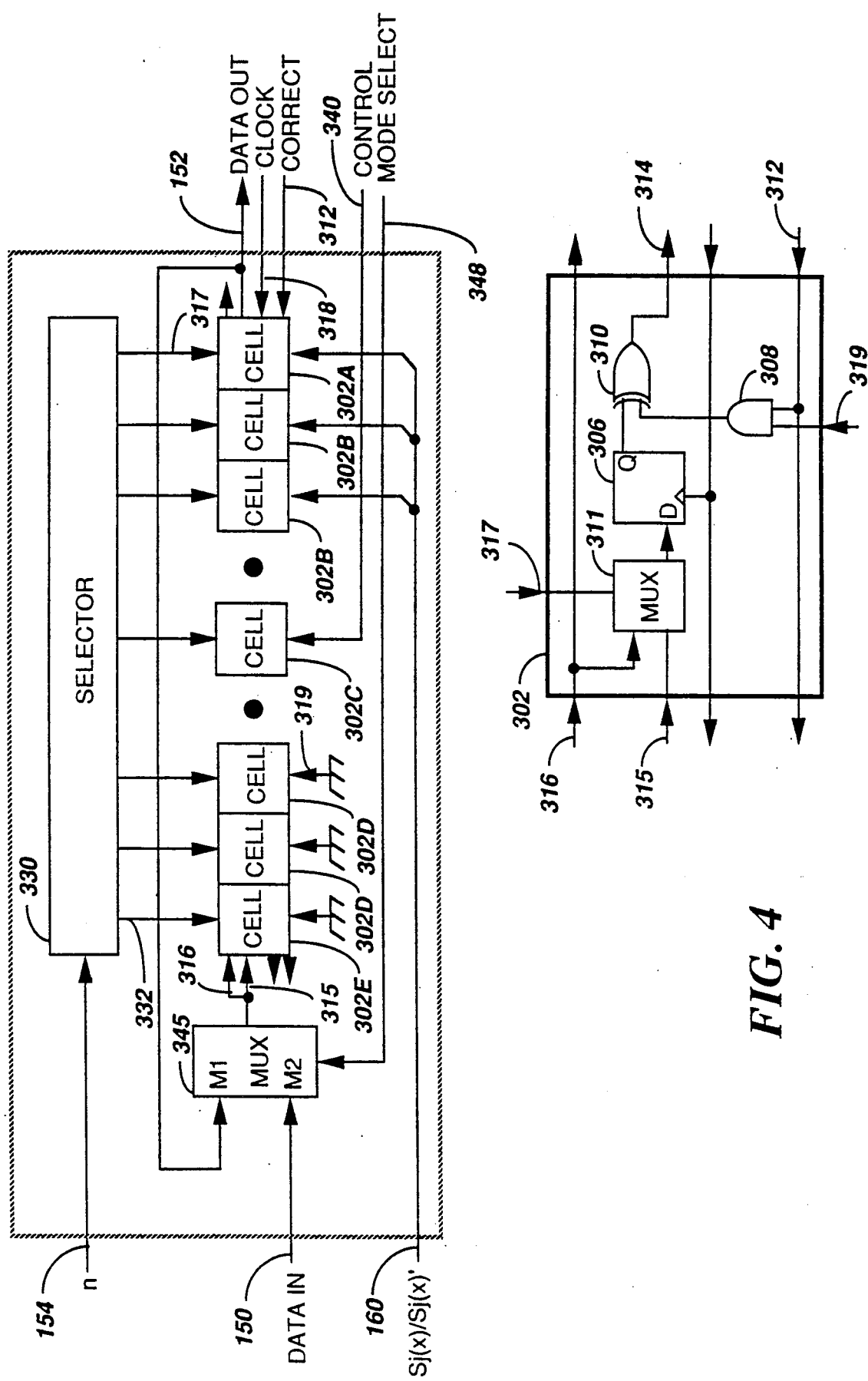
FIG. 4 shows the programmable word length register.

FIG. 4 shows the programmable word length register 300. In the preferred embodiment, the programmable word length register has a maximum size of 32 bits thus providing for a value of "n" up to 32. The register has 32 cells, 302, which provide for varying the number of bits within a code word, rotating the code word, and complementing bit errors during the correction process.

Each cell 302, has a D flip flop 306, an AND gate 308, an exclusive or (XOR) gate 310, and a MUX 311. When the correct signal 312 is low, the output of AND gate 308 is low, thus the output of D flip flop 306 passes through the XOR gate 310 uncomplemented. The output of XOR gate 310 is the cell output 314 which is coupled to cell input 315, of the next cell. MUX 311 selects the input of D flip flop 302 to be either coupled to cell input 315 or data input signal 316. The selection between signals 315 and 316 is made in response to select signal 317. Thus when correct signal 312 is low and select signal 317 selects cell input signal 315, a signal on the clock line 318 causes the cells 302 act as an element of a shift register.

Recall that if sj(x), shown as signal 160 of FIG. 2, has a 1, the location of the 1 corresponds to a bit being in error. When correct line 312 is high, which corresponds to execution of either steps 230 or 235 of FIG. 3, the state of input 319 is available at the output of the AND gate 308. Input 319 of a cells 302a and 302b are coupled to corresponding bits in the sj(x) signal. If input 319 is a 1, this will cause the XOR gate to complement the output of the D flip flop. If the input 319 is a zero, the output of the D flip flop will not be complemented. Consequently, one rotation of the programmable word length register while the correct signal is high will correct bits coupled to sj(x) which are indicated to be in error by sj(x).

The predetermined location used by the covering polynomial technique of step 235 operates in a similar manner. The predetermined location has the location corresponding to cell 302c which has its input 319 set to a 1 in response to execution of step 235 via control signal 340. Inputs 319 of cells 302d and 302e are grounded, a logical 0, because in the preferred embodiment, there are no corresponding sj(x) inputs.

Selector 330 programs the length of the programmable word length register. The selector has 32 outputs 332 coupled to the selector input 317 of each cell. In response to "n" signal 154 the inputs to the corresponding cells are programmed. For example in response to a given code word structure, the following signal would be produced by selector 330:

| CODE WORD | SELECTOR SIGNAL 322 |
| --- | --- |
| (31,21) | 0011 1111 1111 1111 1111 1111 1111 1111 |
| (31,16) | 0011 1111 1111 1111 1111 1111 1111 1111 |
| (23,12) | 0000 0000 0011 1111 1111 1111 1111 1111 |
| (15,7) | 0000 0000 0000 0000 0011 1111 1111 1111 | where the least significant bit of the selector signal is coupled to cell 302a and the most significant bit is coupled to cell 302e. In response to a logical 1 on input 317 a cell selects its input signal to be cell input signal 315 which is coupled to the cell output signal 314 of the adjacent cell. In response to a logical 0 on input 317, a cell selects its input signal to be the data input signal 316. Since the data input signal is available to every cell, the cell corresponding to the least significant logical zero, from the signal produced by selector 330, becomes the data input cell for the programmable length shift register.

MUX 345 selects the input to the data input cell selected by selector 330. When mode select signal 348 indicates "mode 1" as in step 204 of FIG. 2, MUX 345 selects the data input cell to be coupled to data in signal 150. During this mode, data is serially transferred from code word register set 110, to the programmable word length register. The transfer occurs such that the least significant bit of the code word register set 110 ends up shifted into cell 302a. In response to execution of step 210 of FIG. 3, mode signal 348 corresponds to mode 2 in response to which MUX 345 couples the data input cell to output signal 314 of cell 302a. This configuration forms a circular shift register which is used during the correction process, steps 220 and 240 of FIG. 3.

After the correction process is complete, the corrected code word is rotated back into the code word register set 110 through data output signal 152 of FIG. 2, as indicated by step 250 of FIG. 3.

Clock signal 318, correct signal 312, control signal 340 and mode signal 348 correspond to signals 170 generated by control means 200.

Figure 5:
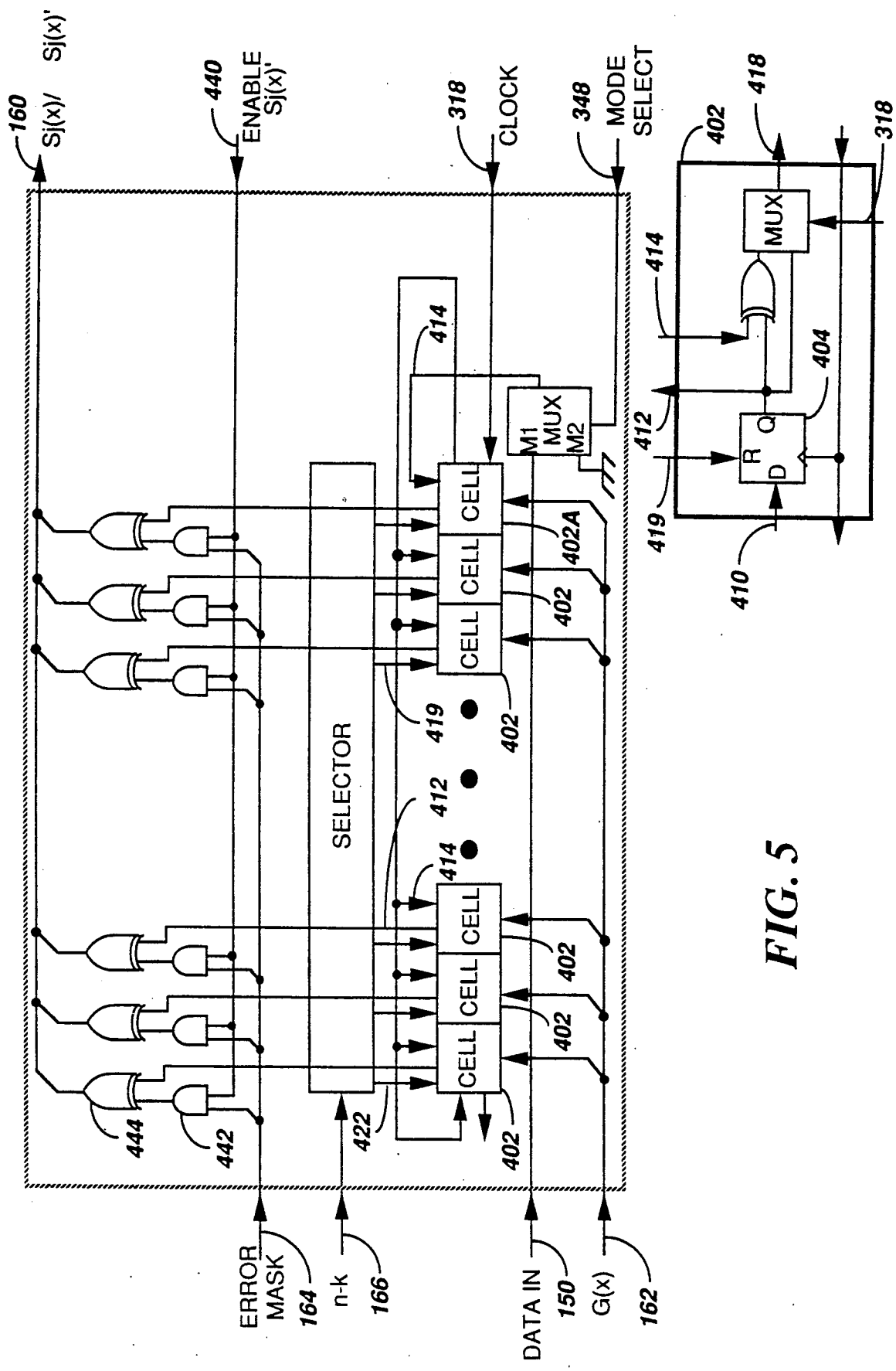
FIG. 5 shows the programmable LFSR.

FIG. 5 shows the programmable LFSR 400. In the preferred embodiments, the programmable LFSR has 16 cells 402 which are used in calculating the syndrome sj(x) and sj(x)'.

Each cell has a resetable D flip flop 404, an XOR gate 406 and a MUX 408. A data bit is input to D flip flop 404 at input signal 410 when clocked by clock signal 318. The output 412 of the D flip flop represents a bit in syndrome sj(x). Output 412 is XORed with input 414. The input 416 of MUX 408 selects between the output 412 of the D flip flop, or the output of the XOR gate 406. The input 416 of MUX 408 is coupled to a corresponding bit in the G(x) register set 108, via G(x) signal 162, thus providing the linear feedback shift register with a feedback value. For example a given code word structure, the following G(x) would be used:

| CODE WORD | G(x) SIGNAL 162 | g(x) FORMULA |
|---|---|---|
| (31,21) | 1111 1100 1011 0111 | $x^{10} + x^9 + x^8 + x^6 + x^5 + x^3 + 1$ |
| (31,16) | 1111 0101 1111 0001 | $x^{15} + x^{11} + x^{10} + x^9 + x^8 + x^7 + x^5 + x^3 + x^2 + x + 1$ |
| (23,12) | 1111 1100 0111 0101 | $x^{11} + x^9 + x^7 + x^6 + x^5 + x + 1$ |
| (15,7) | 1111 1111 0001 0111 | $x^8 + x^7 + x^6 + x^4 + + 1$ |

If the corresponding G(x) bit is a zero, output 418 of MUX 408 is equivalent to the signal 412. If the corresponding G(x) bit is a one, output 418 of MUX 408 is equivalent to the XOR of signal 412 and signal 414. Cell output 418 is coupled to cell input 410 of an adjacent cell. D flip flop 404 also has a reset input 419. In response reset input being a logical 1, the output signal 412 is a logical zero, and thereby effectively disabling the cell.

It can be observed that the least significant bit of G(x) corresponds to the most significant element of the formula for g(x) which is used to calculate the parity. If an element is present in g(x), a corresponding one will occur in the G(x) signal. The correspondence continues from the next least significant bit of G(x) to the next most significant element of g(x). Remaining bits in the G(x) signal are set to a one.

Selector 420 has an output signal 422 which disables cells not used in the syndrome calculation. Output signal 422 has sixteen bits, each bit coupled to the reset input 419 of a corresponding cell 402. Selector 422 produces the output signal in response to the "n−k" signal 166 from the "n−k" register 104.

For example a given code word structure, the following selector signal would be produced by selector 420:

| CODE WORD | SELECTOR SIGNAL 422 |
|---|---|
| (31,21) | 1000 0000 0000 0000 |
| (31,16) | 1000 0000 0000 0000 |
| (23,12) | 1111 1000 0000 0000 |
| (15,7) | 1111 1111 0000 0000 |

This provides a means for programming the length of the LFSR.

The output signal 418 of cell 402a is coupled to the input signal 414 of every cell 402 except cell 402a. This configuration provides the feed back loop. The input signal 414 to cell 402a is coupled to MUX 430 which operates in response to mode signal 348. While the error correcting means is operating in mode 1, MUX 430 couples the input of cell 402a to the data input signal 150, thus calculating a first syndrome while the data is input in mode 1 as in step 204 of FIG. 3. While in mode 2, MUX 430 couples the input of cell 402a to a logical 0. While operating in mode 2, each shift of the register caused by clock signal 318 results in a new sj(x). This configuration is used to calculate new syndromes as indicated in step 220 of FIG. 3. Note that in order for this configuration to operate properly, the G(x) input 416 of the least significant disabled cell must be set to a logical 1.

Subtraction of the error mask from the syndrome as specified by step 216 of FIG. 2 is accomplished by enable signal 440. When enable signal 440 is low, the output of AND gate 442 is low thus the binary state of the output of the cell is not complemented by XOR gate 444. The output of XOR gate 444 corresponds to a bits of the sj(x) signal 160 When the enable signal 440 is a one, the output of AND gate 442 equals the state of the corresponding bit in error mask signal 164. If the corresponding bit is a 1, XOR gate 444 complements the corresponding output 412, other wise the corresponding output is not complemented. This process performs the equivalent of modulo 2 subtracting of the error mask from sj(x) thus forming sj(x)' as specified in step 216 of FIG. 2. Thus when enable signal 440 is low, the output signal 160 corresponds to sj(x). When enable signal 440 is high, the output signal 160 corresponds to sj(x)'.

Enable signal 440, clock signal 318 and mode signal 348 are included within signal 170 from the control means.

In the preferred embodiment, the output, 412, of cell 402a is coupled to the input, 318, of cell 302a, there by establishing sj(x) the correspondence between the programmable word length register and the programmable LFSR. It should be noted the corresponding outputs, 412, of cells 402 adjacent to cell 402a are coupled to the corresponding inputs, 318, of cells 302b adjacent to cell 302a, there by establishing sj(x) the correspondence between the programmable word length register and the programmable LFSR. In the preferred embodiment the coupling between cells 302 and 402 includes AND gate 442 and XOR gate 444.

Additional means are incorporated into the programmable LFSR which reset the D flip flops 404 in each of the cells 402 prior to rotating in the data on the data in line 150.

Figure 6:
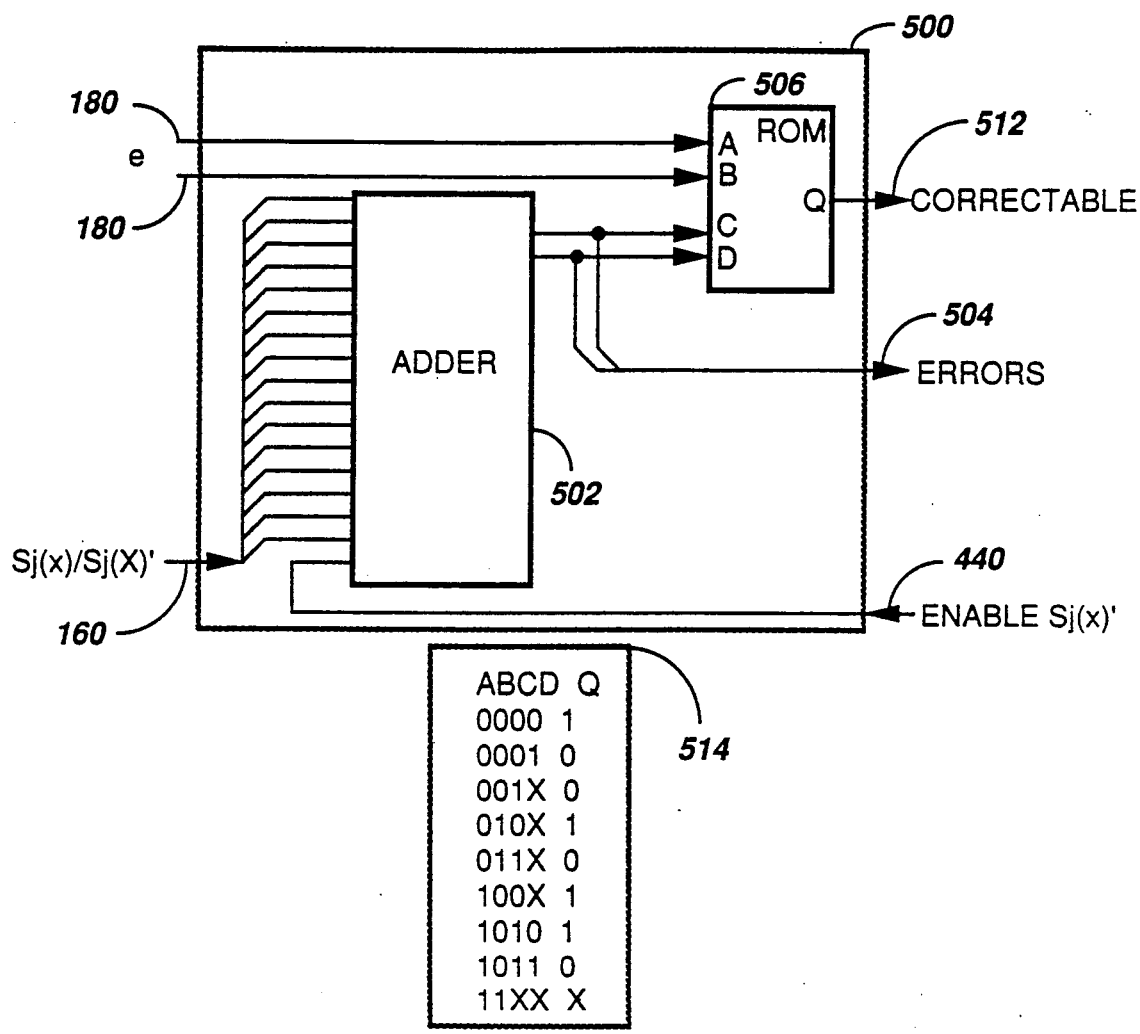
FIG. 6 shows a block diagram of the weight check means.

FIG. 6 shows a block diagram of the weight check means 500, which provides for up to two bit error correction. The sj(x) signal 160 is input into a ADDER 502 which has a 2 bit output. The construction of ADDER 502 is known to those familiar with the art. The output of ADDER 502 is 00, 01 or 10 if the weight of sj(x) is zero, one or two respectively. The output of ADDER 502 is 11 if the weight of sj(x) is greater than two. The output 504, of ADDER 502 is an errors signal which is used by the control means 200 and used to load the errors register 116. The output of ADDER 502 is coupled to the C and D inputs of ROM 506. The "e" signal 180 is coupled to the A and B inputs of ROM 506. The A and B inputs of ROM 506 are 00, 01, or 10, this corresponds the "e" register being programmed to zero, one, or two respectively. A 11 in the "e" register is invalid. ROM 506 has a one bit output signal 512 which is set if the word is correctable and clear if the word is not correctable. Truth table 514 shows the output of ROM 506 as a function of its inputs A, B, C, and D. An X indicates that the corresponding bit may be in either a 0 or 1 logical state. The enable signal 440 is coupled to an input of ADDER 502. When the enable signal is high, sj(x)' is calculated. Coupling the enable signal to an input of ADDER 502 has the effect of increasing the weight of sj(x)' by one. This provides for the proper operation of step 218 and the proper number of errors in error signal 504 in the while calculating sj(x)'.

By inspection, it can be seen than the correctable signal 508 is high when the weight of sj(x) is less than or equal to the value in the "e" register 106, otherwise, the correctable signal is low. Additionally, the errors signal 504 indicates if the weight of sj(x) is zero, one, two or more than two. It should be appreciated with respect to weight checking means 500, that when "e"=2, and enable signal 440 is low, the test of step 212 of FIG. 3 is performed, and when "e"=2 and the enable signal is high, the test of step 218 or FIG. 3 is performed.

It can be further appreciated that the functions of ADDER 502 and ROM 506 may be implemented with less circuitry using combinational logic and/or sequential processes. Such reduction techniques are known to those skilled in the art.

Enable signal 440, correctable signal 512 and errors signal 504 are included within control signal 170 and used by control means 200 during the correction process. Additionally correctable signal 512 and errors signal 504 are included within errors signal 182 and loaded into the errors register 116 under control of control means 200.

It is desirable to reduce circuitry as much as possible in order to provide for smaller and less costly ICs. A number of circuit reductions can be made if only a signal bit error is to be corrected. Single bit error correction is adequate for most applications in paging signalling systems, and an alternate embodiment using only single bit error correction results in reduced circuitry. The circuitry reduction is a result of not starting the correction process as soon as sj(x) has a weight of one, as in step 212, but to delay the correction process until sj(x) equals one This corresponds to a sj(x) where in FIG. 5, only cell 402a has a one, and all other cells have a zero.

By setting "e" to the predetermined value of 1, the "e" value no longer needs to be programmed, thus eliminating the requirement of the "e" register 106 of FIG. 2. Additionally, a covering polynomial is not required for single bit error correction, thus the error mask register set 109 of FIG. 2 can also be eliminated.

By setting "e" to the predetermined value of 1, step 212 of FIG. 3 would be changed to the test "sj(x)=1?". Steps 214, 216, 218 and 235 which deal with 2 bit error correction can be eliminated from the flow chart. Corresponding circuitry from control means 200 can also be eliminated.

By setting "e" to the predetermined value of 1, a number of gates can be eliminated from the programmable word length register of FIG. 4. Since a correction is performed only when cell 402a has a one, and the other cells of FIG. 5 have zeros, only cell 302a of FIG. 4 need include AND gate 308 and XOR gate 310. Thus, eliminating the need for gates 308 and 310 on the remaining cells. This will substantially reduce the circuitry within the programmable word length register.

By setting "e" to a maximum value of 1, a number of gates can be eliminated from the programmable LFSR. Single bit error correction can be performed without the error mask, consequently AND gates 442 and XOR gates 444 can be eliminated from the output of every cell. This reduces the circuitry within the programmable LFSR.

Figure 7:
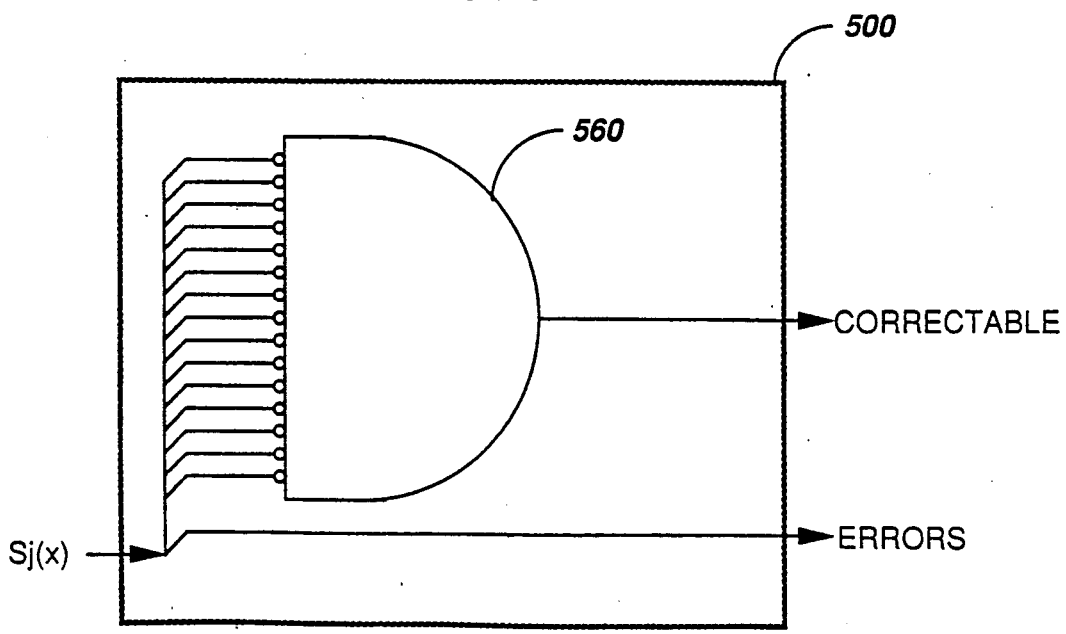
FIG. 7 shows the substantially simplified weight check means.

Finally, by setting "e" to the predetermined value of 1, a substantial simplification can be made to the circuitry within the weight check means 500. FIG. 7 shows the substantially simplified weight check means 500. The sj(x) signal 160 is AND gate 560, with the exception of the sj(x) bit corresponding to the output of cell 402a which is now equivalent to the errors signal 554. The remaining sj(x) bits are coupled to AND gate 560, which has every input inverted. Thus, when the remaining sj(x) bits are zero, a one is produced on correction signal 562 by AND gate 560. A one on correction signal 562 indicates that the word is correctable and has zero or one errors. The number of errors is equivalent to the output of cell 402a.

Thus it has been shown how the programmable error correcting means of FIG. 2 operates. The error correcting means is capable of correcting zero, one or two bit errors, and is capable of being programmed to correct errors on code words having various (n,k,e) structures using various G(x) polynomials. When "n/k" is less than 0.5, a covering polynomial technique using an error mask is used to substantially reduce the amount of processing required to perform the correction process as shown in the prior art. If the maximum number of corrections is limited to one, a number of circuit simplifications can be made if correction step is delayed until sj(x)=1 on a rotation of the programmable LFSR, as opposed to making the correction as soon as the weight of sj(x)=1, as shown in the prior art.

The programmable error correcting means 32 will correct and detect errors in a code word which follows the standard rules for the minimum Hamming distance. In addition it can perform error correction/detection on any cyclic code. A cyclic code is defined as any code which meets two simple rules:

1. The sum of any two code polynomials is also a code polynomial. Using GF(2) addition, if cl(x) is a valid code word and c2(x) is a valid code word then cl(x)+c2(x) is also a valid code word. This condition means the code is linear.

2. If c(x) is a valid code word polynomial of degree $n-1$ then $xjc(x) \bmod x^n - 1$ is also a code word (j=0,1,2 ...). This is equivalent to saying that a cyclic shift of any valid code polynomial is itself a valid code polynomial. The Golay codes (23,12), (15,7), the BCH codes (31,21),(31,16)..., and Hamming codes are all examples of cyclic codes.

The hardware performs a programmable error trapping technique.

Assume:
1. n bits per code word
2. k information bits per code word
3. g(x)=parity generator polynomial (of degree $n-k=r$)
4. i(x)=information polynomial (of degree $k-1$) representing the k information bits.
5. p(x)=parity check polynomial (of degree $n-k-1=r-1$)
6. e(x)=error polynomial (of degree $n-1$)
7. c(x)=code word polynomial (degree $n-1$) made up of the information plus the parity check polynomials.

$$c(x) = p(x) + xri(x)$$

8. sj(x)=Syndrome polynomial (found in the LFSR) after j cycles of the correction phase of the hardware.
9. r(x)=received code word polynomial (may have errors).

$$r(x) = c(x) + e(x) = p(x) + xri(x) + e(x)$$

10. The code words form a finite Abelian group and in addition have the property that $x^j c(x) \bmod x^{in} - 1$ is also a code word, where j=0,1,2 ..., (cyclic code).
11. e represents the number of be corrected.

A code word is serially input to both the Word Length register and the LFSR. The LFSR is in mode one, meaning that a MODg(x) operation is being performed on the input code word. The word length register is also in mode one which is a simple shift register mode so that it will accumulate the entire code word. This will be repeated for n cycles. When this step is complete, all n bits of the code word are received, the LFSR will contain r bits which are the syndrome S0(x) and the Word Length register will contain the received code word. If the received code word, r(x), had no errors in it, then the syndrome S0(x) will be zero. This follows from the fact that the received code word is a sum of an information polynomial i(x), a parity check polynomial p(x), and an error polynomial, where:

$$r(x) = x^r i(x) + p(x) + e(x)$$

but p(x), the parity, was generated using:

$$p(x) = x^r i(x) \bmod g(x)$$

$$\text{so } r(x) = x^r i(x) + x^r i(x) \bmod g(x) + e(x)$$

When this code word is received and input to the LFSR, which does a modg(x) operation, the following occurs:

$$\begin{aligned} r(x) \bmod g(x) &= [x^r i(x) + x^r i(x) \bmod g(x) + e(x)] \bmod g(x) \\ &= [x^r i(x) + x^r i(x) \bmod g(x)] \bmod g(x) + e(x) \bmod g(x) \\ \text{but by inspection } [x^r i(x) + x^r i(x) \bmod g(x)] \bmod g(x) &= 0 \\ r(x) \bmod g(x) &= e(x) \bmod g(x) \end{aligned}$$

An intuitive explanation to this is that parity was generated by finding the remainder, or syndrome, after dividing the information by the generator. Adding the parity to the information guarantees that the code word is evenly divisible, a zero remainder, by the generator. Therefore only the addition of errors in the received word will cause the syndrome (S0(x)) to be nonzero.

This initial syndrome in the LFSR will be termed S0(x) where:

$$S0(x) = e(x) \bmod g(x)$$

In summary, for this step in the operation, the code word is accumulated in the Word Length register and the initial syndrome is calculated ( S0(x) ). The value of the syndrome S0(x) was shown to be dependent only on the error polynomial e(x).

Next, the syndrome Sj(x), where j=0 initially, is tested for a weight of "e" or less, where "e" is the number of errors to be corrected. This check is accomplished by the weight check means. When this check is true (weight(Sj(x))<=e) then the LFSR contains the correction for the word length register value.

If weight of Sj(x)>"e" then the adjusted syndrome (Sj(x)'=Sj(x) "XOR" with the error mask) is tested to see if its weight is less than e−1. If the adjusted syndrome test is true then the correction for r(x) is Sj(x)' along with the inversion of the predetermined bit of the covering polynomial.

If both weight checks fail then calculate $S_{j+1}(x)$ from Sj(x) and calculate $x^j r(x) \bmod x^n - 1$. This simply means to find the next syndrome value from the previous value and to perform a cyclic shift of the received word in the Word Length register. The Word Length register is placed in mode two so that a cyclic shift is being performed. The LFSR is placed in mode two, which performs a modg(x) operation on the input data. The input data to the LFSR is forced to zero in mode two. The details of calculating $S_{j+1}(x)$ and the reason for doing these steps is explained below.

As shown previously, the initial syndrome is a function of only e(x) and does not depend on the actual code word transmitted. Consider splitting the error polynomial e(x) into two parts $e_p(x)$ and $e_i(x)$ where $e_p(x)$ represents the errors in the transmitted parity and $e_i(x)$ represents the errors in the transmitted information. Assuming parity is transmitted first then:

$$e_p(x) = e_0 + e_1 x + \ldots + e_{r-1} x^{r-1} \text{ and}$$

$$e_i(x) = e_r + e_{r+1} x + \ldots + e_{n-1} x^{n-1}$$

Since g(x) is of degree r and $e_p(x)$ is of degree r−1 then any modg(x) division of $e_p(x)$ will return $e_p(x)$. For this reason:

$$\begin{aligned} S0(x) &= e(x) \bmod g(x) = [e_p(x) + e_i(x)] \bmod g(x) \\ &= e_p(x) + e_i(x) \bmod g(x) \end{aligned}$$

If all of the e errors are in the parity ( $e_i(x) = 0$) then:

$$S0(x) = e_p(x)$$

and the weight of S0(x) would be equal to e. This would have been detected earlier in the process and a correction would be performed.

If any error is in the information bits ($e_i(x) \neq 0$) then:

$$S0(x) = e_p(x) + e_i(x) \bmod g(x)$$

It is easy to show that the weight of S0(x) will be greater than "e" when any error(s) occurred in the information bits. The complex part is determining where the error(s) occurred.

Recalling one of the properties of cyclic codes, that $x^j c(x) \bmod x^n - 1$ is a valid code word, or a cyclic shift of a code word is again a code word, and calculating the syndrome of this cycled word we find:

$$\begin{aligned} Sj(x) &= [x^j r(x) \bmod x^n - 1] \bmod g(x) \\ &= x^j r(x) \bmod g(x), \text{ since } g(x) \text{ always divides } x^n - 1. \end{aligned}$$

This statement forms the basis for an "error trapping" technique, which is that:

If $S0(x)$ = initial syndrome after receiving $r(x)$, then $Sj(x)$ = syndrome after $j$ cyclic shifts of $r(x)$ $= x^j S_{j-1}(x) \bmod g(x)$ This says that to calculate what the syndrome would be for j cyclic shifts of the received word, one only has to perform the operation:

$$Sj(x) = x^j S_{j-1}(x) \bmod g(x)$$

In hardware terms this is equivalent to inputting a zero for data into the LFSR (multiplication by x), cycling the LFSR with the feedback taps enabled, which performs the modg(x) operation, and repeating this j times.

This operation is performed one cycle at a time along with a cyclic shift of the received code word r(x) in the Word Length register.

Since the syndrome is only a function of e(x), a cyclic shift of r(x) and recalculating the syndrome is equivalent to a cyclic shift of e(x) and recalculating the syndrome.

If all the errors can be grouped within r bit positions, then eventually these cyclic shifts will move these errors into the r parity locations and the weight check will pass. However, all errors cannot be restricted to this set, and special cases must be handled. It turns out that a judicious choice of these special case error polynomials makes it possible to utilize this hardware method for a large class of cycliC codes. For example a single covering error polynomial of $e(x) = x^{16}$ is sufficient to cover all possible special cases for the BCH (31,21) code. This means that eventually a syndrome or adjusted syndrome will pass, assuming a correctable number of errors were received. As an example of what this does consider the following example for the BCH (31,21) code for which "e"=2.

A code word consisting of 10 parity bits followed by 21 information bits is sent to the hardware error correcting means. Assume the received code word r(x) has an error polynomial of $e(x) = x^i + x^j$ where $(i-j) < 9$ (two errors which Can not be grouped in 10 bits). The initial syndrome S0(x) will fail because the weight will be greater than two, because one error is in the information bits. The received code word r(x) is then cyclically shifted in the word length register so that now the error is $e(x) = x^i - 1 + x^j - 1$. It can be appreciated that eventually one of the error bits will be equal to $x^{16}$ when the other error bit is in the parity locations. This means that if each syndrome (Sj(x)) were adjusted by modulo two subtracting the value of $x^{16} \bmod g(x)$ from Sj(x) and this "adjusted" syndrome, sj(x)' were tested for a weight of "e−1" or less then all special cases could be covered. The correction for r(x) is simply to invert the 16th bit location of r(x) and also apply a normal correction sequence of XORing the syndrome, but in this case the corrected syndrome sj(x)' is used. Then r(x) is rotated bit by bit until r(x) is in its original position.

Thus a mathematical explanation is provided showing why the programmable error correcting means can correct bit errors in certain code word structures.

FIGS. 8 through 12 show the use of the programmable error correcting means. The error correcting means is programmed by a microcomputer executing object code which enables the paging receiver to perform the desired processes. Enabling descriptions of microcomputer based pagers have been shown in U.S. Pat. No. 4,649,583, Mar. 10, 1987 to DeLuca et al, and U.S. Pat. No. 4,755,816, July 5, 1988, to DeLuca which are hereby incorporated by reference. These descriptions combined with description herein are sufficient to enable one familiar with the art to make and use the invention.

Figure 8:
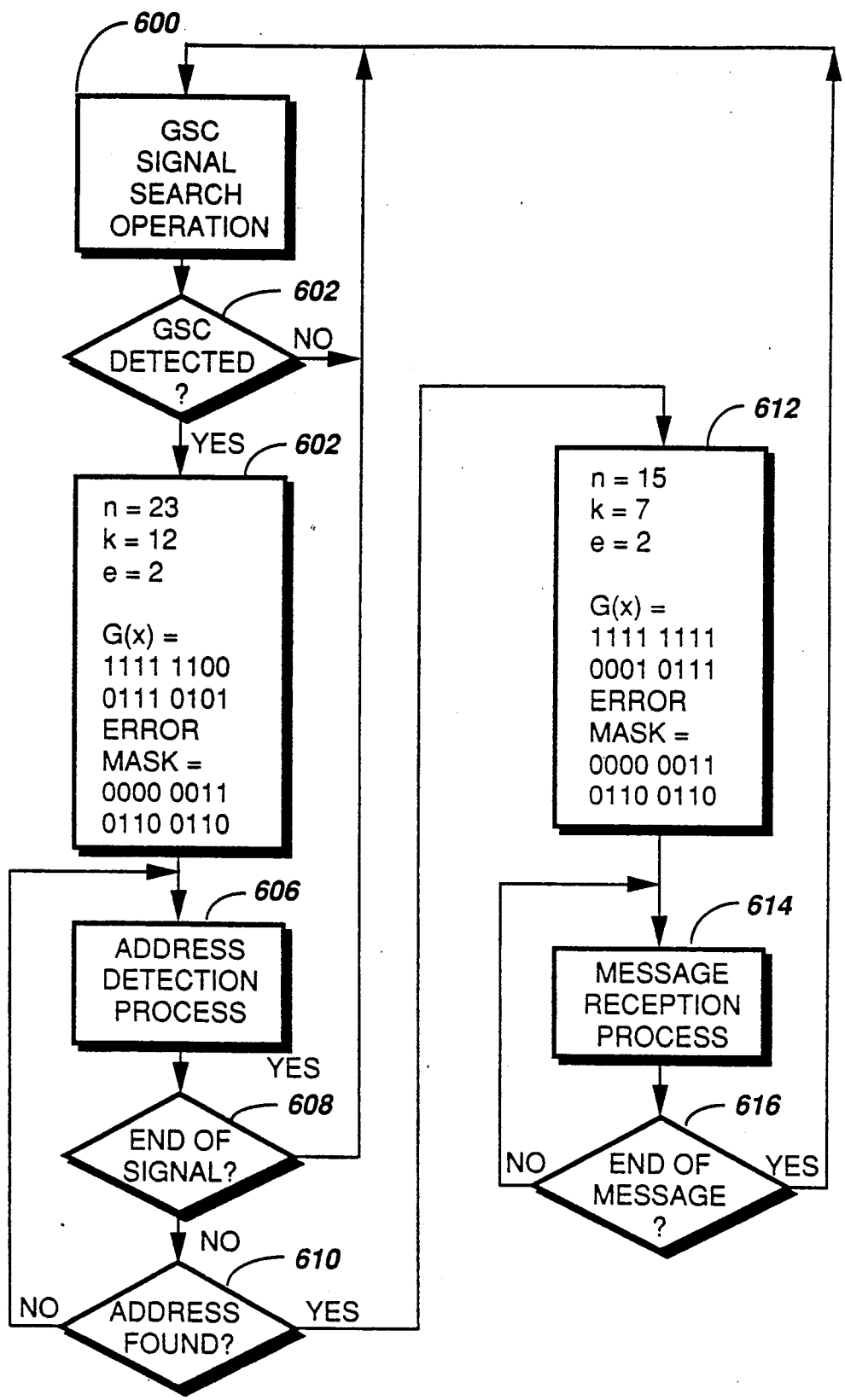
FIG. 8 shows the operation of the programmable error correcting means in an embodiment where the pager is set to receive the GSC paging protocol.

FIG. 8 shows the operation of the programmable error correcting means in an embodiment where the pager is set to receive a predetermined paging protocol. In FIG. 8, the predetermined protocol is GSC. In step 600, a search is made for the GSC signal. If not found, step 602 causes the search operation to continue. If found the program proceeds to step 04 to program register set 100 with the described information. The information provides for (23,12,2) code word correction which may be used for GSC address detection. In step 606, the address detection process is performed. Here received code words are submitted to the error correcting means. The corrected words are used for address detection. Step 608 checks for the end of the signal. If the end of the signal is found, the program returns to step 600 indicating that the pager's address was not found within the signal. If the signal is not ended, the program proceeds to step 610 to check if the pager's address is found. If not found, the program returns to step 606. If an address is found, the program proceeds to step 612 to reprogram register set 100 with the described information. The information provides for (15,7,2) code word correction which is used for GSC data correction. Then in step 614, the message reception process is executed. This involves receiving and deinterleaving data and feeding the deinterleaved code words to the programmable error correcting means for correction. During the process, step 616 checks for the end of the message. If the message is not ended, the program returns to step 614 to continue the message reception process. If the message is ended, the program may return to step 600 to look for the GSC signal.

FIG. 8 shows programming the programmable error correcting means to a first value for n, k and e a first G(x) and a first error mask. Then in response to receiving a first part of a message the programmable error correcting means is programmed to a second value for n and k, and a second G(x). Note that the second programming does not require an error mask, so the error mask is not changed. Also note that the e value remains unchanged between the first and second parts of the message.

Figure 9:
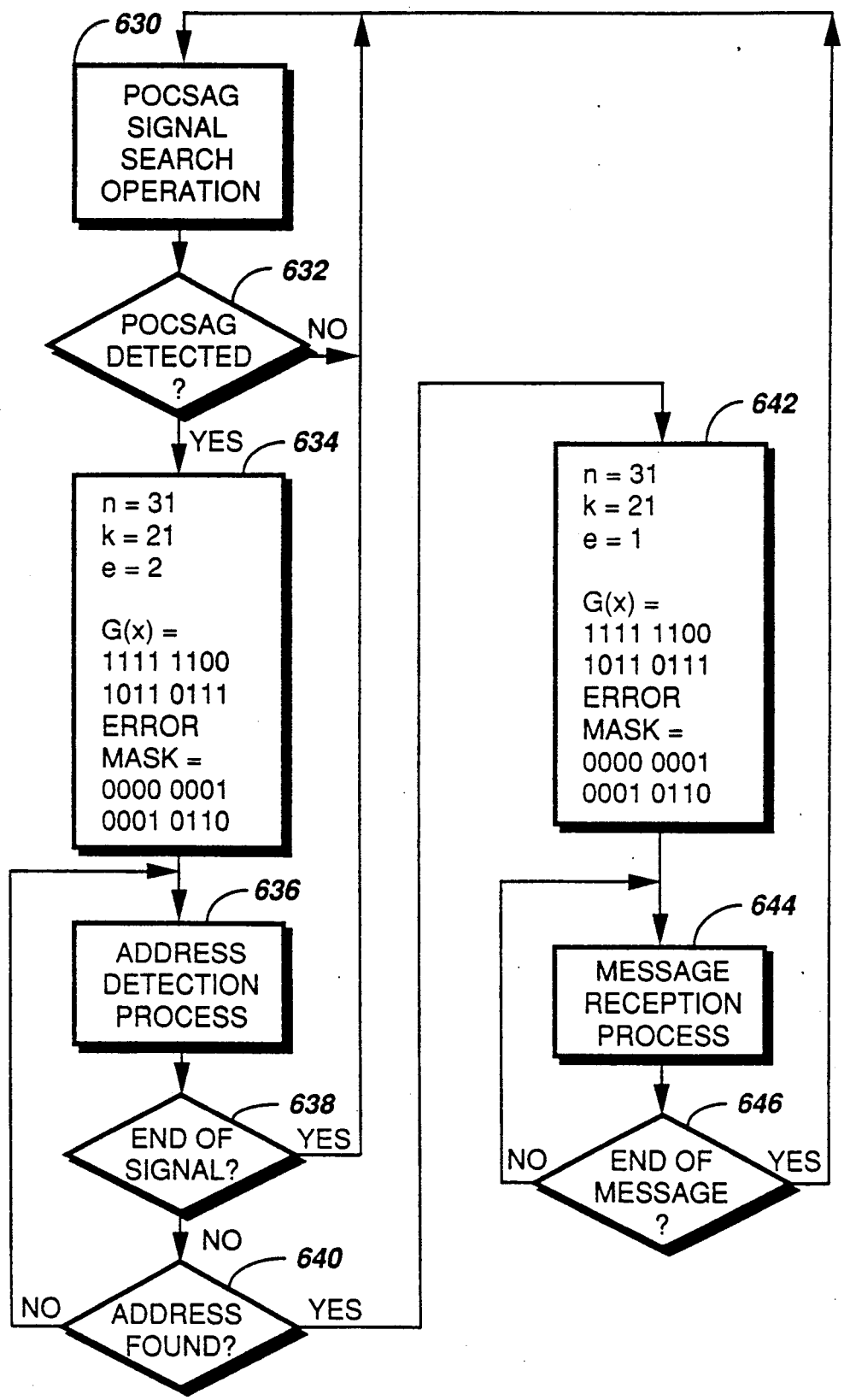
FIG. 9 shows the operation of the programmable error correcting means in an embodiment where the pager is set to receive the POCSAG paging protocol.

FIG. 9 shows the operation of the programmable error correcting means in an embodiment where the pager is set to receive a predetermined paging protocol. In FIG. 9, the predetermined protocol is POCSAG. In step 630, a search is made for the POCSAG signal. If not found, step 632 causes the search operation to continue. If found the program proceeds to step 634 to program register set 100 with the described information. The information provides for (31,21,2) code word correction which may be used for POCSAG address detection. In step 636, the address detection process is performed. Here received code words are submitted to the error correcting means. The corrected words are used for address detection. Step 638 checks for the end of the signal. If the end of the signal is found, the program returns to step 630 indicating that the pager's address was not found within the signal. If the signal is not ended, the program proceeds to step 640 to check if the pager's address is found. If not found, the program returns to step 636. If an address is found, the program proceeds to step 642 to reprogram register set 100 with the described information. The information provides for (32,21,1) code word correction which is used for POCSAG data correction. Then in step 644, the message reception process is executed. This involves receiving and data and feeding the received code words to the programmable error correcting means for correction. During the process, step 646 checks for the end of the message. If the message is not ended, the program returns to step 644 to continue the message reception process. If the message is ended, the program may return to step 640 to look for the POCSAG signal.

FIG. 9 shows programming the programmable error correcting means to a first value for n, k and e a first G(x) and a first error mask. Then in response to receiving a first part of a message the programmable error correcting means is programmed to a second value for e. Note that the second programming does not require an error mask, so the error mask is not changed.

Figure 10:
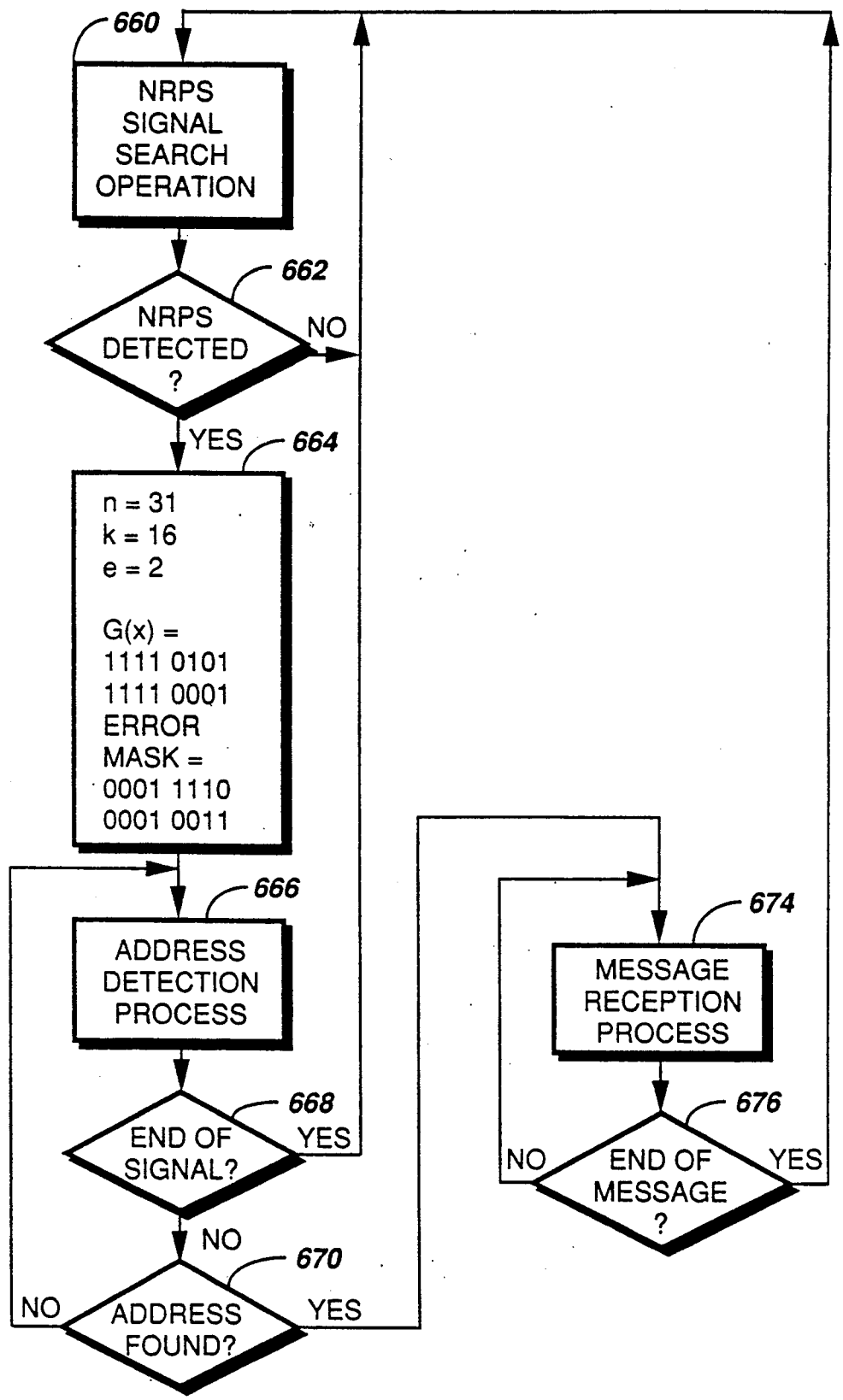
FIG. 10 shows the operation of the programmable error correcting means in an embodiment where the pager is set to receive the NRPS paging protocol.

FIG. 10 shows the operation of the programmable error correcting means in an embodiment where the pager is set to receive a predetermined paging protocol. In FIG. 10, the predetermined protocol is NRPS. In step 660, a search is made, using for the NRPS signal. If not found, step 662 causes the search operation to continue. If found the program proceeds to step 604 to program register set 100 with the described information. The information provides for (31,16,2) code word correction which may be used for NRPS address detection. In step 666, the address detection process is performed. Here received code words are submitted to the error correcting means. The corrected words are used for address detection. Step 668 checks for the end of the signal. If the end of the signal is found, the program returns to step 660 indicating that the pager's address was not found within the signal. If the signal is not ended, the program proceeds to step 670 to check if the pager's address is found. If not found, the program returns to step 666. If an address is found, the program proceeds to step 664, the message reception process. This involves receiving data and feeding the received code words to the programmable error correcting means for correction. During the process, step 676 checks for the end of the message. If the message is not ended, the program returns to step 674 to continue the message reception process. If the message is ended, the program may return to step 660 to look for the NRPS signal.

FIG. 10 shows programming the programmable error correcting means to a first value for n, k and e a first G(x) and a first error mask. These values are not changed throughout the operation of the program.

FIGS. 8, 9 and 10 show three individual paging receivers capable of operating on a single paging signal. The software included with the microcomputer is capable of processing only one signalling protocol. Therefore, the microcomputer 48 of FIG. 1 would be capable of receiving only the protocol provided for by the software loaded into the microcomputer program memory.

Figure 11:
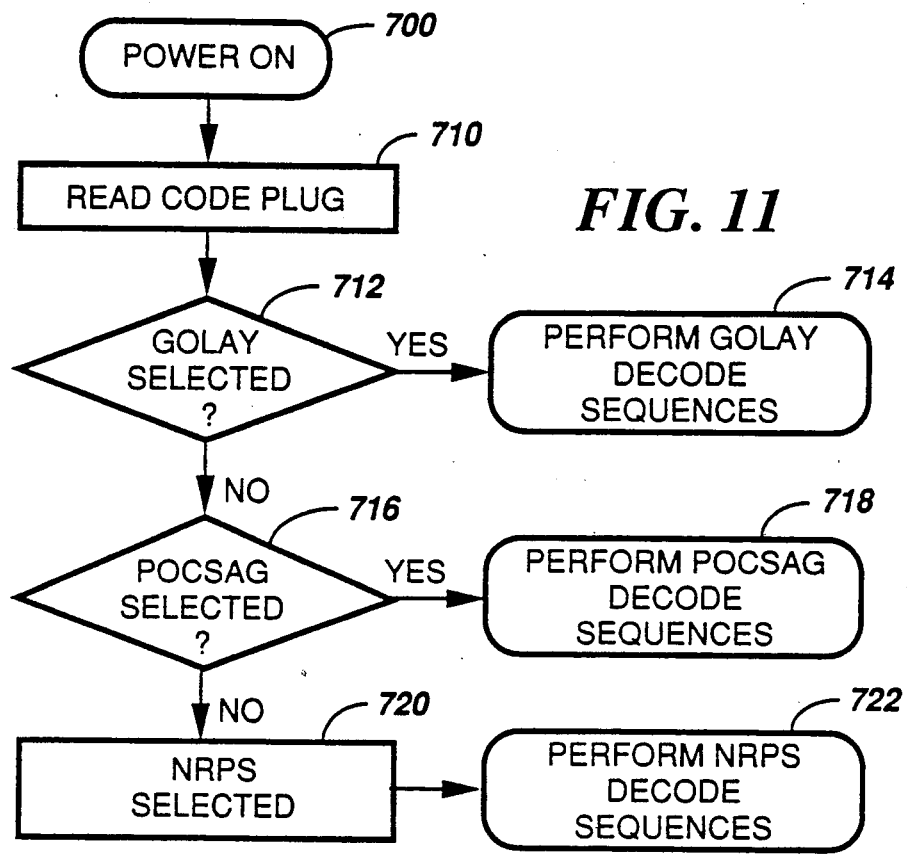
FIG. 11 shows a paging receiver having a microcomputer which has software capable of receiving all three protocols, and the selection between the protocols is made by bits in a code plug.

FIG. 11 shows a paging receiver having a microcomputer which has software capable of receiving all three protocols. The selection between the protocols is made by bits in code plug 56 of FIG. 1. This provides for selection of a paging protocol at the time of programming of the pager code plug. Beginning at step 700 of FIG. 11, step 700 indicates the step of initial power on of the pager. Then in step 710, the code plug is read. Next in step 712 the bits indicating the selected protocol are read to check if GSC was selected. Then if GSC was selected, the program proceeds to step 714 to decode GSC. The steps necessary to decode GSC are shown in FIG. 8. If in step 712 GSC was not selected, the program proceeds to step 716 to determine if POCSAG was selected. If POCSAG was selected, the program proceeds to step 718 to decode POCSAG. The steps for decoding POCSAG are shown in FIG. 9. Referring back to step 716, of POCSAG was not selected, NRPS is selected as indicated by step 720. The program proceeds to step 722 to decode NRPS. The steps for decoding NRPS are shown in FIG. 10.

Thus FIG. 11 describes a pager having a programmable error correcting means wherein the error correcting means is programmed in response to the contents of the code plug. Additionally, as shown in FIGS. 8 and 9, the programmable error correcting means may be reprogrammed during the course of receiving a message.

Figure 12:
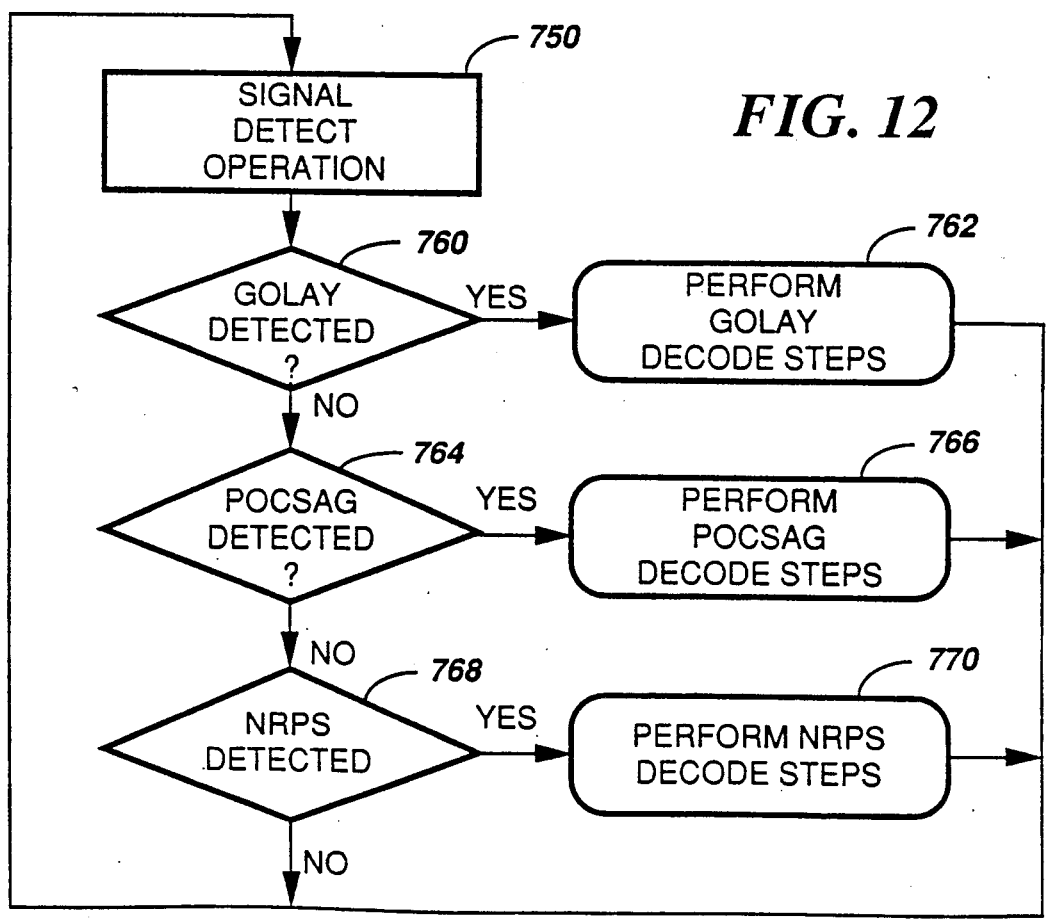
FIG. 12 shows a the operation of the programmable error correcting means in a paging receiver capable of decoding three protocols and a means for identifying the presence of a transmitted protocol.

FIG. 12 shows a the operation of the programmable error correcting means in a paging receiver capable of decoding three protocols and having a means for identifying the presence of a transmitted protocol, such as means 30 of FIG. 1. The signal detection operation, step 750 of FIG. 12 is performed by means 30 of FIG. 1. Then the program proceeds to step 760 to check if GSC is detected. If GSC detected, the program proceeds to step 762 to perform GSC decode steps. The GSC decode steps correspond to steps 604-616 of FIG. 8, where upon completion the program returns from either step 610 or 616 to step 750 of FIG. 12. If in step 760, GSC was not detected, the program proceeds to step 764 to check if POCSAG is detected. If POCSAG is detected, the program proceeds to step 766 to perform POCSAG decode steps corresponding to steps 634-646 of FIG. 9. Upon completion, the program returns from either step 640 or 646 to step 750 of FIG. 12. If in step 764, POCSAG was not detected, the program proceeds to step 768 to check if NRPS is detected. If detected the program proceeds to step 770 to decode NRPS, which includes steps 664-674 of FIG. 10. Upon completion, the program returns from either step 670 or 676 to step 750 of FIG. 12. If in step 768, NRPS is not detected, the program returns to step 750.

FIG. 12 shows programming the programmable error correcting means in response to the type of signal detected. If a POCSAG signal is first detected, followed by a NRPS signal, the value n would remain constant, while k would and G(x) would be varied. Thus modifying the ratio of total bits to parity bits while keeping the total bits the constant is shown, wherein the modification is in response to a received signal.

It should be appreciated that if a paging receiver of FIG. 11 or FIG. 12 were to only receive either POCSAG or NRPS, the programmable error correcting means could be designed with a fixed word length register having 31 bits, since both of these signalling systems use a 31 bit word. Removing the programmability from the word length register reduces the circuitry required for the programmable error correcting means. In this case the n register 102 can also be eliminated.

Furthermore, it should be appreciated that if a pager were to only decode a POCSAG signal, the programmable error correcting means need only be programmed to correct one or two bit errors. Since the n, k, G(x) and the error mask are constant for both the (31,21,2) and (31,21,1) code word structures much of the programmability of the programmable word length register and the programmable LFSR may be removed, thereby further simplifying the circuitry within the programmable error correcting means. For example the LFSR could be fixed to a length of 10 bits, the error mask is predetermined and can be incorporated into the design of the LFSR, thereby eliminating the need for error mask register 109. Since G(x) is constant, it also could be incorporated into the design of the LFSR thereby eliminating the need for the G(x) register 108. Similarly, n−k is constant and the n−k register 104 would also be eliminated.

While the above principles of the invention have been described with a specific apparatus, it is to be clearly understood that this description is made by way of example only and not a limitation to the scope of the invention as set forth in the accompanying claims.

What is claimed is:

1. An error correcting means for correcting two bit errors in data within a code words structure, the code word structure having n total bits, k information bits and n−k parity bits, the parity bits generated by multiplying the k information bits by a generator polynomial g(x), and the data having two bit errors separated by more than k−n bits, said error correcting means comprising:

memory means for storing the data, said memory means capable of shifting the data, said memory means having a first correcting means for complementing n−k locations within said memory means and a second correcting means for complementing a single predetermined bit location;

linear feedback shift register means having a length of n−k and programmed with a feedback value corresponding to g(x) of the code word structure, wherein said linear feedback shift register receives the data and calculates a first syndrome, further wherein each shift of the linear feedback register calculates a subsequent syndrome;

subtracting means for producing a masked syndrome by subtracting a predetermined value from said first and subsequent syndromes;

weight check means for generating a correct signal in response to said masked syndrome having a weight of one, thereby having a single logical one and n−k−1 logical zeros in the masked syndrome; and control means responsive to said weight check means for causing shifting of said memory means and said linear feedback shift register means and for causing the first correcting means to complement one bit in said memory means corresponding to the location of the logical one within the masked syndrome and for causing the second correcting means to complement the single predetermined bit in response to the correct signal.

2. The error correcting means of claim 1 wherein the predetermined value corresponds to a syndrome resulting from a bit error occurring in the predetermined bit location.

3. The error correcting means of claim 1 wherein said error correcting means consists essentially of combinational and sequential logic circuits.

4. The error correcting means of claim 2 wherein said error correcting means is integrated together with a microprocessing means on a single monolithic integrated circuit, wherein said microprocessing means operates said error correcting means.

5. A method of correcting two bit errors in data within a code words structure, the code word structure having n total bits, k information bits and n−k parity bits, the parity bits generated by multiplying the k information bits by a generator polynomial g(x), and the data having two bit errors separated by more than k−n bits, said method comprising the steps;

(a) storing the code word data in a memory means, said memory means capable of shifting the data, said memory means having a first correcting means for complementing n−k locations within said memory means and a second correcting means for complementing a single predetermined bit location;

(b) calculating a first masked syndrome by subtracting a predetermined value from a first syndrome calculated by shifting the code word data into a linear feedback shift register;

(c) checking the masked syndrome to have a weight of one, thereby having a single logical one and n−k−1 logical zeros in the masked syndrome;

(d) shifting the data within the memory means and calculating a subsequent masked syndrome by subtracting the predetermined value from a subsequent syndrome calculated by shifting the linear feedback shift register;

(e) repeating steps (c) and (d) until a masked syndrome having a weight of one is found; and (f) complementing one bit in said first correcting means corresponding to the location of the logical one within a prime syndrome and complementing the single predetermined bit in the second correcting means in response to finding the masked syndrome having a weight of one.

6. The method of claim 5 further comprising the step of restoring the data within the memory means to a position equivalent to the position of the code word prior to said shifting of step (d).

7. The method of claim 5 further wherein steps (d), (e), and (f) are not performed if the first syndrome is equal to zero.

8. A programmable error correcting means for correcting bit errors in data within one of a plurality of code word structures, each code word structure having n total bits, k information bits and n−k parity bits, the parity bits generated by multiplying the k information bits by a generator polynomial g(x), wherein the combination of n, k and g(x) are unique to each code word structure, said error correcting means comprising:

selecting means for determining the code word structure of the data;

memory means for storing the data, said memory means capable of shifting the data, said memory means having a first correcting means for complementing locations within said memory means;

programmable linear feedback shift register means programmed with a feedback value corresponding to g(x), and said programmable linear feedback shift register further programmed to receive the n bits of data and calculate a first syndrome in response to the reception thereof, wherein each shift of the linear feedback register calculates a subsequent syndrome, and further wherein the first and subsequent syndromes have n−k bits, and further wherein the values of n, k, and the feedback value corresponding to g(x) are programmed in response to the code word structure determined by said selecting means;

weight check means for generating a first correct signal in response to the first or subsequent syndromes having a weight less than or equal to a first predetermined value, thereby having a number of logical ones less than or equal to the first predetermined value; and control means responsive to said weight check means for causing shifting of said memory means and said linear feedback shift register means and for causing said first correcting means to complement the bits corresponding to the locations of the logical ones within the first or subsequent syndromes in response to the first correct signal.

9. The programmable error correcting means of claim 1 wherein said memory means is programmed to function as a shift register of length n, wherein the length of n is programmed in response to the code word structure determined by said selecting means, and wherein the output of the shift register is coupled to the input of the shift register, thereby providing for circular shifting of the data within said memory means and further.

10. The programmable error correcting means of claim 8 wherein the first predetermined value is one and the programmable error correcting means is capable of correcting a single bit error within the data.

11. The programmable error correcting means of claim 8 wherein the first predetermined value is two and the programmable error correcting means is capable of correcting up to two bit errors within the data so long as the two bit error are separated by n−k or less bits.

12. The programmable error correcting means of claim 8 wherein the first predetermined value is three and the programmable error correcting means is capable of correcting up to three bit errors within the data so long as the three bit error are separated by n−k or less bits.

13. The programmable error correcting means of claim 8 wherein the first predetermined value is associated with the code word structure determined by said selecting means.

14. The programmable error correcting means of claim 8 wherein said selecting means is comprised within a microprocessing means and memory means, said programmable linear feedback shift register means, said weight check means and said control means consists essentially of combinational and sequential logic circuits which are integrated together with the microprocessing means on a single monolithic integrated circuit.

15. The programmable error correcting means of claim 8 further comprising;
    subtracting means for producing a masked syndrome by subtracting a second predetermined value from said first and subsequent syndromes; and wherein
    said memory means further having a second correcting means for complementing a single predetermined bit location within said memory means;
    said weight check means being additionally responsive to the masked syndrome generates a second correct signal in response to the masked syndrome having a weight less than or equal to a second predetermined value, thereby having a number of logical ones less than or equal to the second predetermined value; and
    control means responsive to said weight check means for causing shifting of said memory means and said linear feedback shift register means and for causing said first correcting means to complement the bits corresponding to the locations of the logical ones within the masked syndromes and said second correcting means to complement said single predetermined bit location within said memory means in response to the second correct signal.

16. The programmable error correcting means of claim 15 wherein the first predetermined value is one and the second predetermined value is two and the predetermined bit location is selected in order to provide for two bit error correction wherein the two bit errors may occur anywhere within the data.

* * * * *